United States Patent
Confalonieri et al.

(10) Patent No.: US 6,897,801 B2
(45) Date of Patent: May 24, 2005

(54) HIGH-SPEED, HIGH-RESOLUTION AND LOW-CONSUMPTION ANALOG/DIGITAL CONVERTER WITH SINGLE-ENDED INPUT

(75) Inventors: Pierangelo Confalonieri, Caponago (IT); Marco Zamprogno, Cesano Maderno (IT); Angelo Nagari, Cilavegna (IT)

(73) Assignee: STMicroelectronics S.r.l., Agrate (IT)

( * ) Notice: Subject to any disclaimer, the term of this patent is extended or adjusted under 35 U.S.C. 154(b) by 0 days.

(21) Appl. No.: 10/483,790

(22) PCT Filed: Jun. 13, 2002

(86) PCT No.: PCT/EP02/06487

§ 371 (c)(1),
(2), (4) Date: Jul. 6, 2004

(87) PCT Pub. No.: WO03/007479

PCT Pub. Date: Jan. 23, 2003

(65) Prior Publication Data

US 2004/0233093 A1 Nov. 25, 2004

(30) Foreign Application Priority Data

Jul. 10, 2001 (IT) .................................... RM2001A0407

(51) Int. Cl.[7] ........................... H03M 1/12; G06F 7/64; G06G 7/18; G06G 7/19
(52) U.S. Cl. ....................................... 341/172; 327/337
(58) Field of Search .................................. 341/172, 118, 341/120, 139, 161, 144, 156, 150; 327/94, 337

(56) References Cited

U.S. PATENT DOCUMENTS

| | | | |
|---|---|---|---|
| 4,975,701 A | * 12/1990 | Babanezhad et al. | ....... 341/139 |
| 5,581,252 A | 12/1996 | Thomas | |
| 5,675,340 A | 10/1997 | Hester et al. | |
| 6,400,302 B1 | * 6/2002 | Amazeen et al. | ........... 341/172 |
| 6,448,911 B1 | * 9/2002 | Somayajula | ................. 341/120 |
| 6,473,021 B1 | * 10/2002 | Somayajula et al. | ........ 341/172 |
| 6,538,594 B1 | * 3/2003 | Somayajula | ................. 341/172 |
| 6,559,789 B1 | * 5/2003 | Somayajula | ................. 341/172 |
| 6,667,707 B2 | * 12/2003 | Mueck et al. | ................ 341/172 |
| 6,707,403 B1 | * 3/2004 | Hurrell | ........................ 341/120 |
| 6,720,903 B2 | * 4/2004 | Confalonieri et al. | ........ 341/172 |
| 6,753,801 B2 | * 6/2004 | Rossi | .......................... 341/161 |

FOREIGN PATENT DOCUMENTS

| | | |
|---|---|---|
| EP | 1 039 642 B1 | 3/2004 |
| JP | 63-300627 | 12/1988 |

* cited by examiner

Primary Examiner—Patrick Wamsley
(74) Attorney, Agent, or Firm—Lisa K. Jorgenson; E. Russell Tarleton; Seed IP Law Group PLLC (57) ABSTRACT

An A/D converter having capacitors of a first array of sampling capacitors weighted in binary code connected between a first common circuit node and an input terminal to be charged to an input voltage with respect to a ground of a signal to be converted, and in accordance with SAR technique are then selectively connected with two differential reference terminals, and at the same time capacitors of a second array equal to the first and all connected to a second node are selectively connected to ground and the lower differential voltage terminal. The two nodes are connected to the respective inputs of a comparator. A logic unit controls the connections of the capacitors of the two arrays in accordance with a predetermined timing program and as a function of the output of the comparator.

18 Claims, 5 Drawing Sheets

HIGH-SPEED, HIGH-RESOLUTION AND LOW-CONSUMPTION ANALOG/DIGITAL CONVERTER WITH SINGLE-ENDED INPUT

BACKGROUND OF THE INVENTION

1. Field of the Invention

The present invention pertains to an A/D (analog/digital) converter and more particularly to an integrated, single-ended input A/D converter that has a high-speed and low current consumption for generating a differential output.

2. Description of the Related Art

It is very common for electronic equipment to require analog signals to be converted into digital signals. A significant example of this type of equipment is provided by digital cellular telephones. The requirements of low consumption and high performance associated with these applications create particularly exacting conditions for the design of the integrated circuits that constitute the electronic system of the equipment.

A type of A/D converter particularly advantageous for employment in these electronic systems is the one that makes use of capacitors weighted in binary code with associated switches that are controlled by a logic circuit in accordance with a technique known as SAR (Successive Approximation Register).

When designing complex integrated circuits, it is generally sought to obtain a large dynamic range and a good immunity to noise originating both within and without the integrated circuit by realizing the part that processes the analog signal with structures of a completely differential type.

In certain cases, however, the analog signals that have to be converted into digital form are not of the differential type, that is to say, in the form of voltage variations of a sign opposite to a common reference potential, but are rather of an asymmetric or single-ended type, i.e. in the form of a single voltage variable with respect to a reference potential. In these cases the designer has two alternatives: one can either use A/D converters that function with single ended input signals or transform the signal into a differential signal and then apply it to an A/D converter that functions with differential input signals. In the former case one has to find means, if possible, for avoiding the negative effects of noise and the other intrinsic limitations associated with the processing of a single-ended signal, while in the latter case one has to accept a higher consumption and other undesired effects (distortion and offset) of the circuit that has to precede the converter.

With a view to obviating the drawbacks of both these alternatives, there has been proposed an A/D converter with single-ended input, as described in EP-A-1039642, that presents the advantages of a differential structure without requiring a circuit to transform the single-ended signal into a differential one. This known converter makes use of four capacitance arrays in place of the two arrays provided in a converter with a differential input, and from the constructional point of view this means that the integrated circuit comprising the converter will occupy a rather large area, while from the functional point of view it brings in its wake a considerable increase in electric power consumption and the need for having to use a high-sensitivity comparator to compensate the smaller voltage excursion at the comparator input. This implies a reduced operating speed or, alternately, the construction of a comparator providing a better performance and therefore inevitably a larger size and costlier energy consumption.

BRIEF SUMMARY OF THE INVENTION

The disclosed embodiments of the present invention provide an A/D converter that, apart from being able to perform the direct conversion of a single ended signal and having a noise immunity at least equal to that of a converter for differential signals, will also be capable of being realized with an integrated circuit occupying a small area, have a low consumption and make possible a high operating speed without calling for a particularly sensitive comparator.

According to the invention, a converter is provided that includes:

a first array of sampling capacitors weighted in binary code, each connected between a first circuit node and a central terminal of a controlled switching device associated therewith, said device having a multiplicity of terminals selectively connectable with the central terminal;

a second array of sampling capacitors weighted in binary code, each connected between a second circuit node and a central terminal of a controlled switching device associated therewith, said device having a multiplicity of terminals capable of being selectively connected with the central terminal;

reference voltage generator means comprising a common reference terminal, a first and a second differential reference terminal, and a common mode reference terminal;

an input terminal for analog signals referred to the voltage of the common reference terminal;

first and second controlled connection means connected, respectively, to the first and the second circuit node for selective connection to the common mode reference terminal;

a voltage comparator having a first and a second input terminal connected, respectively, to the first and the second circuit node, and an output terminal;

processing, control, and register means connected to the output of the comparator, to the controlled switching devices, associated with the capacitors and to the controlled connection means to operate said switching devices and said connection means in accordance with a predetermined timing program and as a function of the output of the comparator, to memorize the states of at least some of the switching devices associated with the capacitors and to furnish output signals corresponding to the analog signals applied to the input terminal;

wherein the multiplicity of selectively connectable terminals of each of the switching devices of the first capacitor array comprises a first terminal connected to the input terminal and a second and a third terminal connected, respectively, to the first and the second differential reference terminal; and the multiplicity of selectively connectable terminals of each of the switching devices of the second array comprises a first terminal connected to the common reference terminal and a second terminal connected to the second differential reference terminal.

In accordance with another embodiment of the invention, an A/D converter is provided that includes a first array of sampling capacitors weighted in binary code, each connected between a first circuit node and a central terminal of a controlled switching device associated therewith, said device having a multiplicity of terminals selectively connectable with the central terminal; a second array of sampling capacitors weighted in binary code, each connected between a second circuit node and a central terminal of a controlled switching device associated therewith, said device having a multiplicity of terminals capable of being selectively connected with the central terminal; reference voltage generator means comprising a common reference terminal, a first and a second differential reference terminal, and a common mode reference terminal; an input terminal for analog signals referred to the voltage of the common reference terminal; first and second controlled connection means connected, respectively, to the first and the second circuit node for selective connection to the common mode reference terminal; a voltage comparator having a first and a second input terminal connected, respectively, to the first and the second circuit node, and an output terminal; processing, control, and register means connected to the output of the comparator, to the controlled switching devices, associated with the capacitors and to the controlled connection means to operate said switching devices and said connection means in accordance with a predetermined timing program and as a function of the output of the comparator, to memorize the states of at least some of the switching devices associated with the capacitors and to furnish output signals corresponding to the analog signals applied to the input terminal; wherein the multiplicity of selectively connectable terminals of each of the switching devices of the first capacitor array comprises a first terminal connected to the input terminal and a second and a third terminal connected, respectively, to the first and the second differential reference terminal; and the multiplicity of selectively connectable terminals of each of the switching devices of the second array comprises a first terminal connected to the common reference terminal and a second terminal connected to the second differential reference terminal.

In accordance with yet a further embodiment of the invention, an analog-to-digital converter is provided that includes a first capacitive array comprising a plurality of capacitors each having a first terminal coupled to a first node and a second terminal selectively coupleable to one of an input terminal, a first reference terminal, and a second reference terminal; a second capacitive array comprising a plurality of capacitors, each capacitor having a first terminal coupled to a second node and a second terminal selectively coupleable to one of a common reference terminal and the second reference terminal; a comparator having a first input coupled to the first node, a second input coupled to the second node, and a first output selectively coupleable to the first node, a second output selectively coupleable to the second node, and a third output; a first supplementary capacitor having a first terminal coupled to the first node and a second terminal selectively coupleable to one from among the first reference terminal and the second reference terminal, and a second supplemental capacitor having a first terminal coupled to the second node and a second terminal selectively coupleable to one of the first reference terminal and the second reference terminal; a processing circuit having an input coupled to the third output of the comparator, and an output for generating digital output signals in response to analog input signals received at the input terminal; and control outputs coupleable to the first and second capacitive arrays and the first and second supplemental capacitors upon which are generated control signals.

BRIEF DESCRIPTION OF THE DRAWINGS

The invention will be more clearly understood from the detailed description about to be given of some embodiments thereof, which are to be considered as examples and not limitative in any way, said description making reference to the attached drawings of which.

DETAILED DESCRIPTION OF THE INVENTION

For the sake of simplicity of representation, the figures show converters that convert an analog signal by sampling it with binary numbers consisting of only five bits, but in actual practice it is clearly possible to realize converters with a much larger number of bits.

Figure 1:
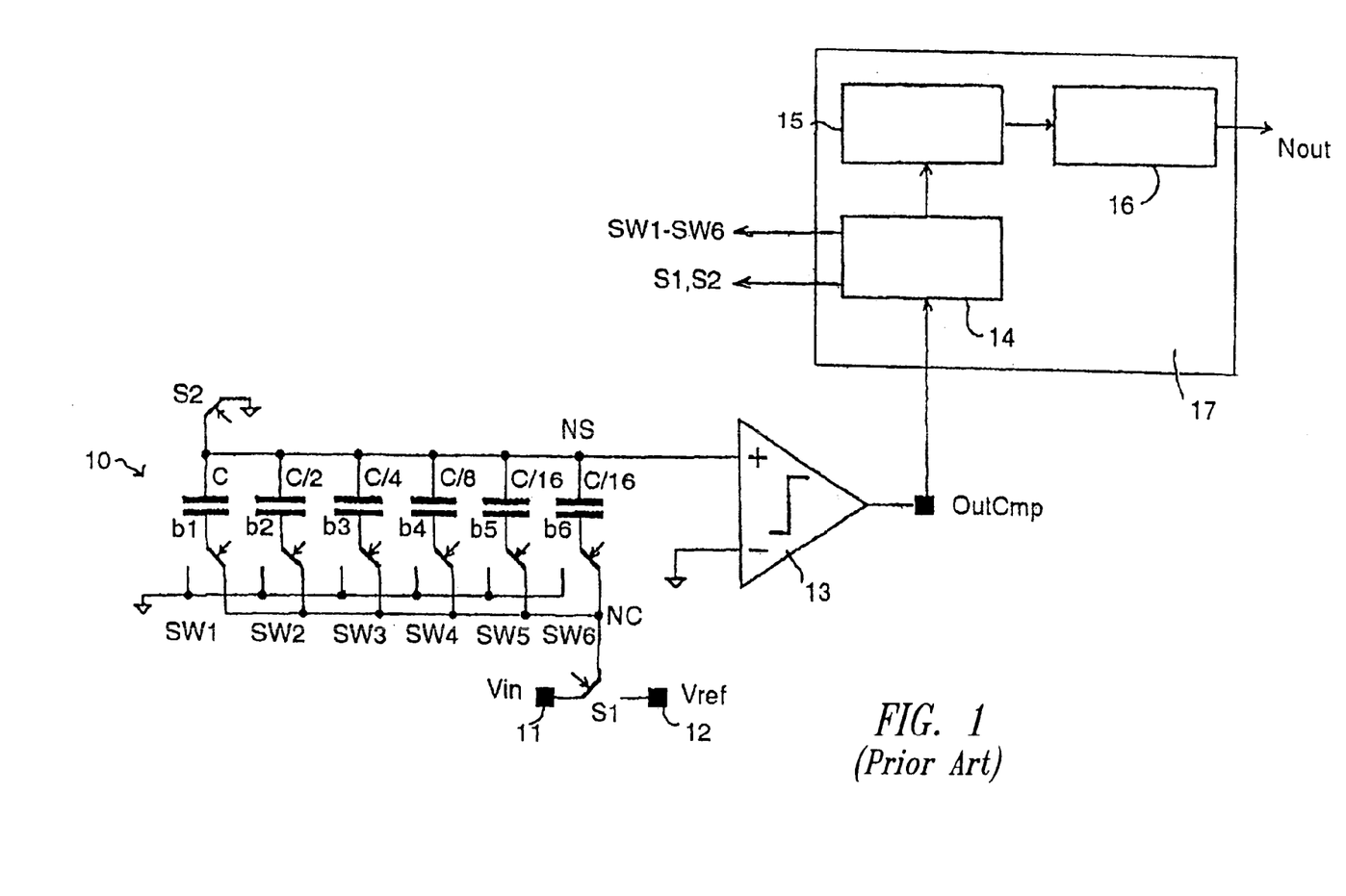
FIG. 1 shows an A/D converter for single-ended signals of the known type and operating in accordance with SAR technique.

The circuit diagramme of FIG. 1 shows an array—indicated by the reference number 10—of six capacitors b1–b6, each of which is associated with one of the switches SW1–SW6. The capacitors from b5 to b1 are weighted in binary code, i.e. have capacitance values that increase in accordance with the factor $2^i$, where i=0, 1, 2, 3, 4. The sixth capacitor b6, which has the same capacitance as capacitor b5, serves to make the sum of the capacitances of the array exactly equal to twice the capacitance of capacitor b1.

One electrode of each of the capacitors is connected to a common terminal NS. The switches serve to connect the other electrode of each of the capacitors selectively to either a first terminal, indicated by NC, or to a second terminal, indicated by the ground symbol. The terminal NS may either be connected to ground or left free by means of a switch S2. By means of a switch S1, the terminal NC can be selectively connected either to an input terminal 11, to which there is applied an input signal Vin (a potential with respect to ground), or to a reference terminal 12, to which there is applied a reference potential Vref.

The terminal NS is connected to the non-inverting input terminal of an operational amplifier 13 that acts as a comparator. The inverting terminal of operational amplifier 13 is connected to ground. The output OutCmp of the comparator is connected to a processing, control and register unit that is indicated by the reference number 17, said unit comprising a logic control unit 14, a register 15 and a circuit 16 for reading the register. More particularly, the output OutCmp is connected to the logic control unit 14 that, in its turn, is connected to the switches SW1–SW6, the switch S2 and the switch S1 and operates them in accordance with a predetermined timing program and the comparator output. It will be understood that the switches in actual practice consist of controllable electronic connection devices such as MOS transistors or combinations of MOS transistors. The logic unit 14 is also connected to the register 15, which serves to memorize the position of the switches SW1–SW5. The register reading circuit 16 provides as its output a digital signal Nout corresponding to the analog input signal Vin. A converter similar to the one of FIG. 1 is described, for example, in "Analog MOS Integrated Circuits" by Gregorian and Temes, published by WILEY, pp. 420–425.

Put very briefly, the converter operates as follows:

In a first phase the switches are controlled by the logic unit 14 in such a manner as to be in the positions shown in FIG. 1, i.e. with the terminal NC connected via the switch S1 to input terminal 11, to which there is applied the signal Vin to be converted, with the terminal NS connected via the switch S2 to ground and with all the lower electrodes of the capacitors connected via their associated switches SW1–SW6 to the terminal NC, so that all the capacitors are charged to the voltage Vin.

In the next phase the logic unit 14 causes switch S2 to open and then operates the switches SW1–SW6 in such a manner as to connect the lower electrodes of all the capacitors to ground, with the result that the common terminal NS of array 10 will be charged to the voltage −Vin.

At this point logic unit 14 starts the typical operations of the SAR technique aimed at identifying—one after the other—the bit values that make up a binary number that represents the sample of the input voltage; more particularly:

With a view to finding the most significant bit, the switches SW1 and S1 are operated to connect the lower electrode of capacitor b1 of the greatest capacitance (C) to terminal 12, which is at the reference voltage Vref. This causes the voltage of the terminal NS to be raised from −Vin to −Vin+Vref/2. The reference voltage Vref is chosen so as to be equal to the maximum voltage Vin to be converted.

If the voltage −Vin+Vref/2 is negative, comparator 13 will provide a low output signal, and the logic unit 14 will maintain the switch SW1 in the position in which the lower electrode of the capacitor b1 is connected to the reference terminal 12 (Vref) and will transmit this position information to the register 15 as corresponding to a bit 1:

When the voltage −Vin+Vref/2 is positive, comparator 13 will have a high output signal and the logic circuit 14 will bring the switch SW1 back into the position in which the capacitor b1 is connected to ground and will transmit this position information to the register 15 as corresponding to a bit 0.

The same operation will be performed for the capacitor b2 to find the second bit, and so on for all the remaining capacitors, with the exclusion of only the last one, b6, which remains connected to ground for the entire duration of the SAR operations.

At the end of the operation the register 15 will contain five bits that represent the final positions of the switches SW1–SW5 and the binary code corresponding to the measurement of the sample of the input voltage Vin.

As mentioned at the beginning, the operation of a single-ended A/D converter like the one that has just been described can be negatively affected by noise. Indeed, it should be noted that the reference voltage Vref, which is usually generated by a circuit situated on the same substrate on which there is formed the converter with the other analog and digital circuits, is subject to the noise of the supply voltage and the noise that the other circuits induce in the substrate. Similarly, any noise present at the ground terminal at the moment when the switch S2 is opened will be memorized on the terminal NS. Furthermore, the capacitance that the switch S2 (normally an MOS transistor) assumes with respect to the terminal NS will become discharged when the switch opens, thus causing a voltage variation of the terminal NS (the so-called feed-through effect). This variation gives rise to a conversion offset, that is to say, a component that is not due to the input signal and may prejudice the accuracy of the conversion.

Figure 2:
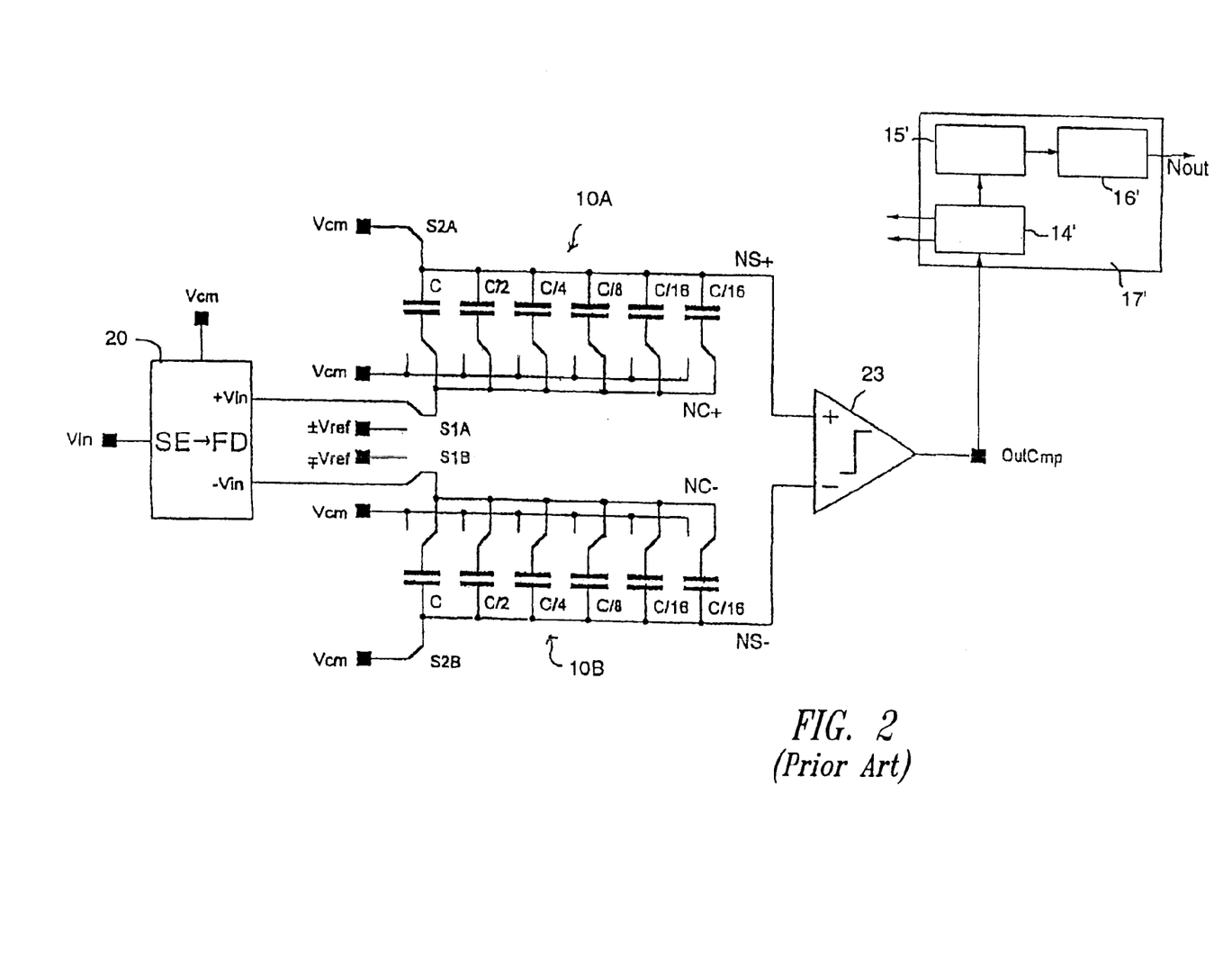
FIG. 2 shows the schematic circuit diagramme of an A/D converter for single-ended signals that uses a circuit for transforming single-ended signals into differential signals.

With a view to avoiding these difficulties, as already mentioned at the beginning, it has been proposed to transform the single-ended signal into a differential signal and then to perform the conversion with a differential converter. A circuit structure realizing this proposal is schematically illustrated in FIG. 2.

The analog signal to be converted, indicated once again by Vin, is applied to the input of a circuit 20 capable of transforming a single-ended input voltage into two differential output voltages +Vin and −Vin (in the figure SE→FD means single-ended to fully differential). In actual practice the circuit 20 could consist substantially of an operational amplifier with an appropriate feedback.

Applied to circuit 20 is a so-called common mode voltage Vcm, which constitutes the reference voltage of the differential output voltages +Vin and −Vin. The differential output voltages +Vin and −Vin are applied via a switch S1A, S1B to two capacitors arrays 10A and 10B, equal to the array 10 of FIG. 1 except for the fact that the terminals corresponding to the terminals connected to ground are at the common mode voltage Vcm and those corresponding to the terminal connected to the reference voltage Vref are at a differential voltage that has a positive value (+Vref) and a negative value (−Vref) with respect to the common mode voltage Vcm. The common terminals NS+ and NS− of the two arrays are connected, respectively, to the non-inverting and the inverting terminal of a comparator 23 similar to the comparator 13 of FIG. 1.

A logic unit 14' controls the switches in accordance with a program that is altogether analogous to the one utilized by the logic unit 14 of FIG. 1. It should however be noted that the switches of capacitor array 10A are controlled at the same time as the corresponding switches of capacitor array 10B and that the reference voltages are applied in push-pull mode, that is to say, whenever a capacitor of array 10A is at Vref, its counterpart in array 10B is at −Vref. A register 15' and a register reading unit 16' similar to those indicated by the reference numbers 15 and 16 of FIG. 1, as well as the logic unit 14', form part of a processing, control and register unit 17' similar to the one indicated by 17 of the converter in accordance with FIG. 2.

The converter described above makes it possible to obtain a good noise immunity. Indeed, any noise superposed on the common mode voltage Vcm will be memorized in an identical manner by the two capacitor arrays 10A and 10B, so that the voltage difference between the terminals NS+ and NS−, which are also the input terminal of the converter, will not be affected by the noise. During the successive approximation phase, moreover, the number of capacitors of array 10A connected to Vcm via the respective switches associated with them will be equal to the number of capacitors of array 10B connected to Vcm and the capacitors connected to +Vref or −Vref will have their homologous capacitors connected to, respectively, Vref or +Vref. Since the reference voltage is differential and the interferences are in a common mode, any interference that affects Vcm and ±Vref will have practically no effect on the precision of the conversion.

As already mentioned at the beginning, the converter in accordance with FIG. 2 is associated with some drawbacks deriving from the addition of circuit 20 that transforms the single-ended signal into a completely differential one, drawbacks that to some extent nullify the advantages of the conversion into differential form and include greater energy consumption, distortion of the signal that is to be converted, and conversion offset.

Figure 3:
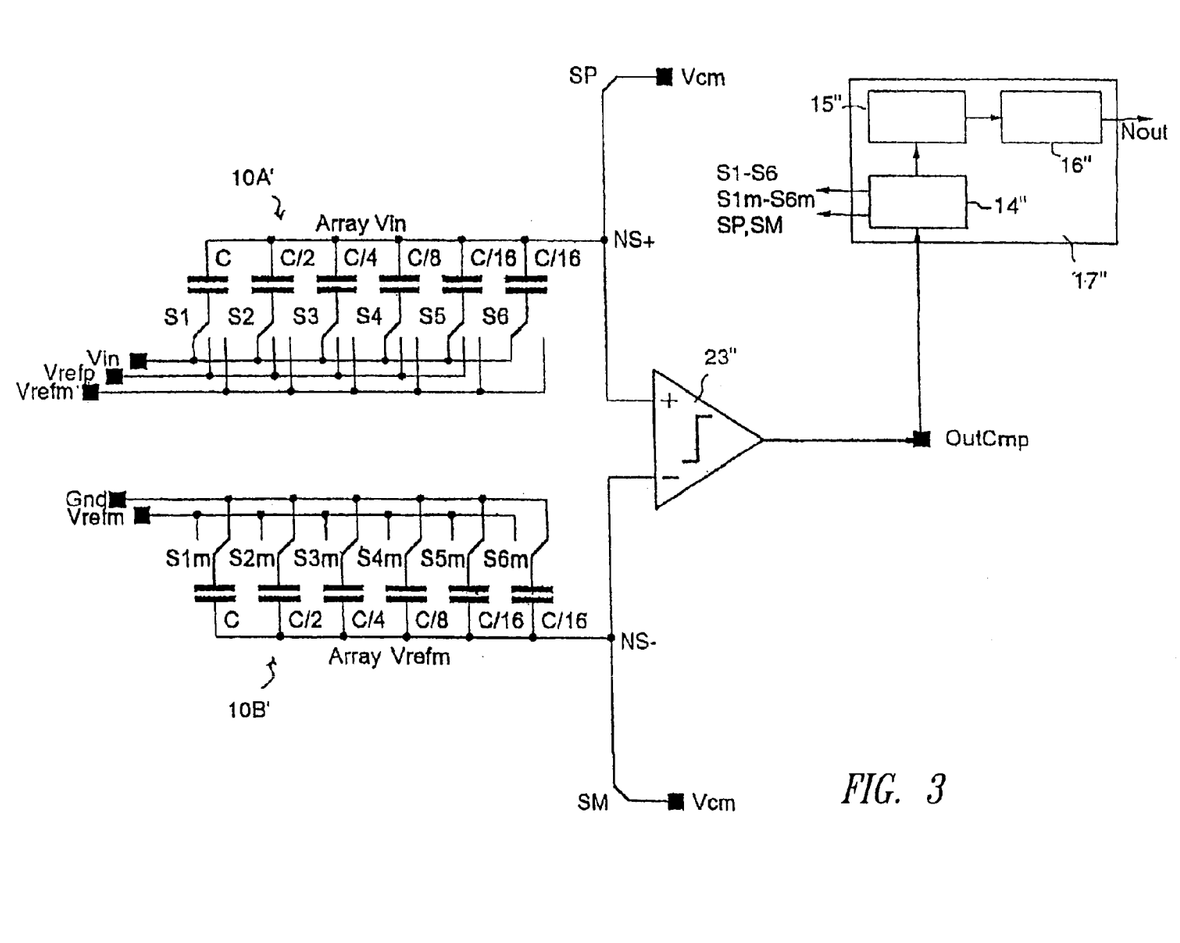
FIG. 3 shows the schematic circuit diagramme of an A/D converter for single-ended signals in accordance with a first embodiment of the invention.

The A/D converter in accordance with the embodiment of the invention shown in FIG. 3 has a first capacitor array indicated by the reference number 10A' and the expression Array Vin, which is equal to array 10A of FIG. 2, and a second capacitor array indicated by the reference number 10B' and the expression Array Vrefm, which is equal to array 10B of FIG. 2, as well as a voltage comparator 23" and a processing, control and register unit 17" comprising a logic unit 14", a register 15" and a reading unit 16" like the converter of FIG. 2, but differs from the known converter in several important respects. More particularly, the switches of array 10A', indicated by S1–S6, are three-way switches, each with a central terminal, connected to a capacitor of the array, which can therefore be selectively connected to one of three terminals, namely the input terminal of the converter, i.e. the output of a source of voltage signals that have to be converted (Vin), and a first and second reference terminal, i.e. the outputs of an appropriate reference voltage source (Vrefp, Vrefm). The switches S1m–S6m of array 10B' are two-way switches like those of array 10B of the circuit of FIG. 2 and connect the capacitors selectively to one or the other of two terminals connected, respectively, to the ground terminal (Gnd) and the second reference terminal Vrefm. As can be seen, there are no switches similar to those indicated by S1A and S1B in FIG. 2, nor is there a circuit to transform the single-ended input signal into a differential signal. The identically weighted capacitors of the two arrays 10A' and 10B' are preferably equal to each other, but the invention may also be advantageously implemented with capacitors that are not wholly identical.

The voltages Vrefp and Vrefm are two differential reference voltages referred to the common mode voltage Vcm. Vcm will preferably be situated at the centre of the range defined by Vrefp and Vrefm. Solely for indicative purposes, the following values might be associated with an integrated circuit where the supply voltage Vdd=2.5 Volt: Vrefp=2 Volt, Vrefm=0.5 Volt, and Vcm=1.25 Volt. The ground terminal Gnd is the common reference terminal of the integrated circuit and coincides with the lower-voltage terminal of the supply source, assumed to be equal to zero. The voltage signals Vin are referred to the ground potential and may assume values comprised between 0 and Vrefp-Vrefm.

Let us now consider the actual functioning of the converter in accordance with the invention as represented in FIG. 3. In the initial charging phase the logic unit 14" generates control signals such that the switches SP and SM will be closed, while all the switches S1–S6 of array 10A' will be in the position in which they connect the capacitors to the terminal Vin and all the switches S1m–S6m of array 10B' will be in the position in which they connect the capacitors to the ground terminal Gnd. In this phase the capacitors of array 10A' become charged to the voltage Vcm–Vin and the capacitors of array 10B' become charged to the voltage Vcm.

The conversion by means of the SAR technique briefly described in connection with FIG. 1 commences in the next phase: The switches SP and SM are opened, the switch S1 associated with the most highly weighted capacitor (C) is brought into the position in which it connects to the terminal Vrefp, the switches S2–S6 are brought into the position in which the capacitors associated with them are connected to the terminal Vrefm and the switches S1m–S6m are likewise connected to the terminal Vrefm. This operation brings the node NS+ to the voltage Vcm–Vin+Vrefm/2+Vrefp/2 and the node NS– to the voltage Vcm+Vrefm. Applying the example values mentioned above, the node NS+ will thus be at (2.5–Vin) Volt and the node NS– at 1.75 Volt. If the difference between the voltages at the nodes NS+ and NS– (–Vin+Vrefp/2, i.e. 0.75 Volt–Vin) is negative, the switch S1 will remain in the position in which it connects to the terminal Vrefp, and the register 15" will record this position information as corresponding to a bit 1; but if it is positive, the logic unit 14" will bring switch S1 into the position in which it connects to the terminal Vrefm and will transmit this position information to the register 15" as corresponding to a bit 0.

A similar operation is carried out for the capacitor of the next highest weighting (C/2) to find the second most significant bit and so on for all the remaining capacitors, excluding only the last (C/16), which remains connected to the terminal Vrefm for the entire duration of the SAR operation. During these operations the switches S1m–S6m remain in the position that connect them with the terminal Vrefm.

The converter just described has numerous advantages as compared with the prior art. First of all, it should be noted that during the phase of charging to the voltage Vin the array 10A' is connected between Vcm and Vin and the array 10B' is connected between Vcm and ground: since the voltage Vin is referred to ground, possible interferences tending to vary the ground potential will have no effect at all, because the capacitors of array 10B' will be charged to a voltage determined by the effective swing of the input signal between the effective ground potential and Vin, and the capacitors of array 10A' will be charged to a voltage referred to the same effective ground potential. Furthermore, during the SAR conversion operations one of the terminals of the capacitors of array 10A' is brought to the voltage Vrefp or Vrefm and one terminal of the capacitors of array 10B' is maintained at the voltage Vrefm. Since the reference voltages Vrefp and Vrefm are generated by a differential structure, any interferences will become superposed with the same sign on both the reference voltages, i.e. they will have the same effect on both comparator inputs and, consequently, will not in any way alter the measurement.

The circuit therefore complies with the aim of obtaining the direct conversion of a single-ended analog signal by means of a structure that has all the advantageous characteristics of a structure functioning with differential inputs. It should be noted that this result is obtained without adding any capacitive elements as has to be done, for example, in the case described in EP-A-1039642 and without having to use particularly sensitive comparators, since the input voltage Vin is not reduced by capacitive dividers and is therefore at its highest possible value. Moreover, the consumption is very small and the source of the reference voltages Vrefp and Vrefm does not need an output buffer of greater power than is usually required for a completely differential comparator in the same operating conditions, because the capacitive charges are only those of the two capacitor arrays 10A' and 10B'.

Figure 4:
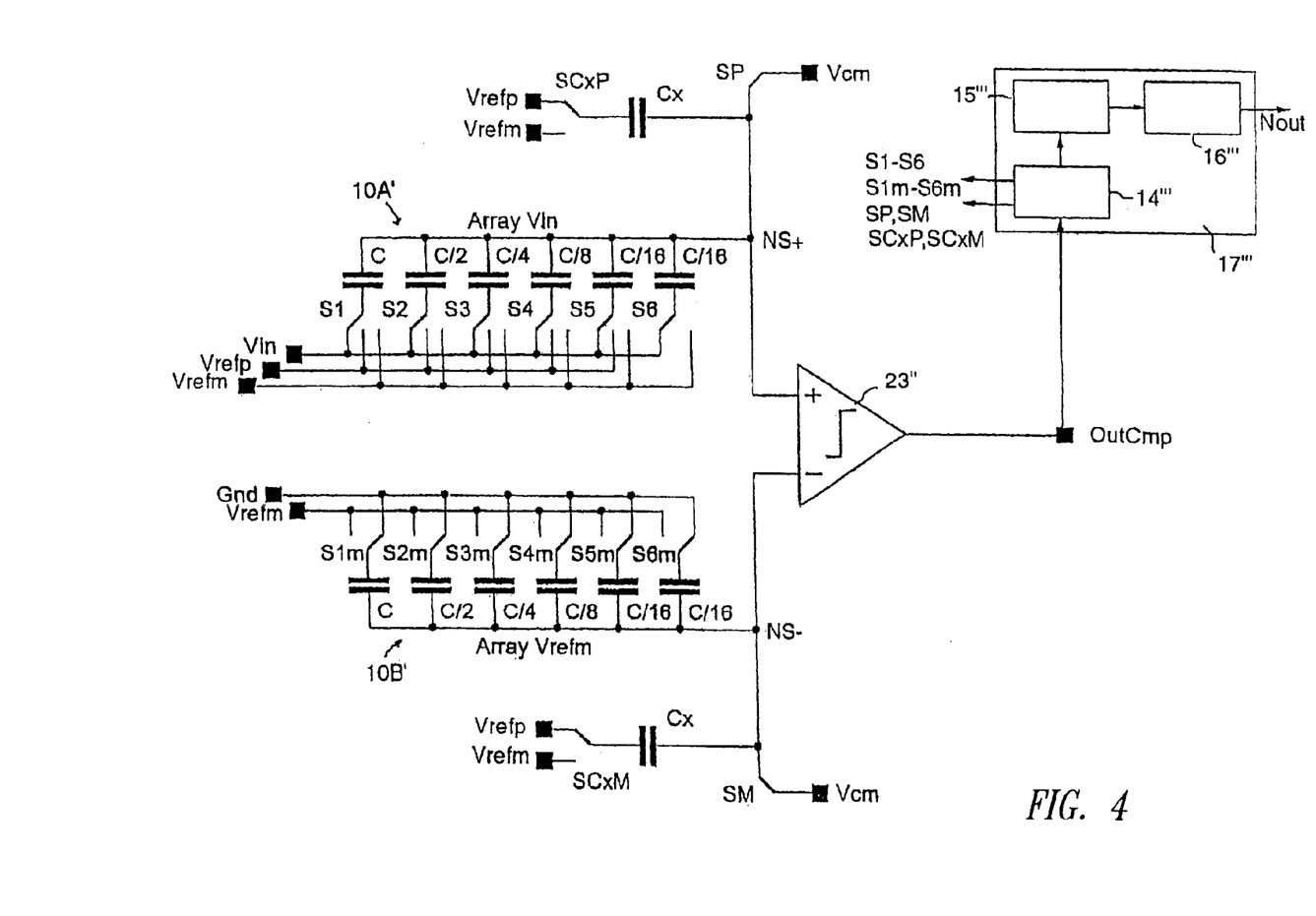
FIG. 4 shows a second embodiment of the invention and FIG. 5 shows a third embodiment of the invention.

The embodiment described in FIG. 3 will perform best in applications in which the lower reference voltage (Vrefm) is close to ground potential, because the common mode voltage at which the comparator 23' works is not Vcm, as would be desirable in order to have the maximum switching speed, but rather Vcm+Vrefm. However, action can be taken to fix the common mode voltage to Vcm at the expense of a small reduction of the dynamic range of the comparator input. As shown in FIG. 4, for example, each of the nodes NS+ and Ns– can be connected to a capacitor Cx that can be switched by means of respective switches SCxP, ScxM between the two reference voltages Vrefp and Vrefm. The switches SCxP and ScxM are controlled by the logic unit, here indicated by 14''', in such a way as to connect the two capacitors Cx to the terminal Vrefp during the charging of the capacitors of array 10A, to the input voltage Vin and to the terminal Vrefm during the SAR conversion operations. If the common mode voltage of the comparator is to be substantially maintained at the predetermined value Vcm, the capacitance of each of the capacitors has to be Cx=2C*(Vrefm)/(Vrefp–Vrefm).

According to a variant that can be used to good advantage when the supply voltage of the integrated circuit can be chosen within a narrow range, the capacitors may be switched between the extremes Vdd and Gn of the supply voltage rather than between Vrefp and Vrefm. In this case the capacitance of the two capacitors has to be Cx'=2C* (VrefmNdd). This variant has the advantage that no capacitances remain connected to the source of the differential voltages Vrefp, Vrefm while the array 10A' is being charged to the input voltage Vin.

Figure 5:
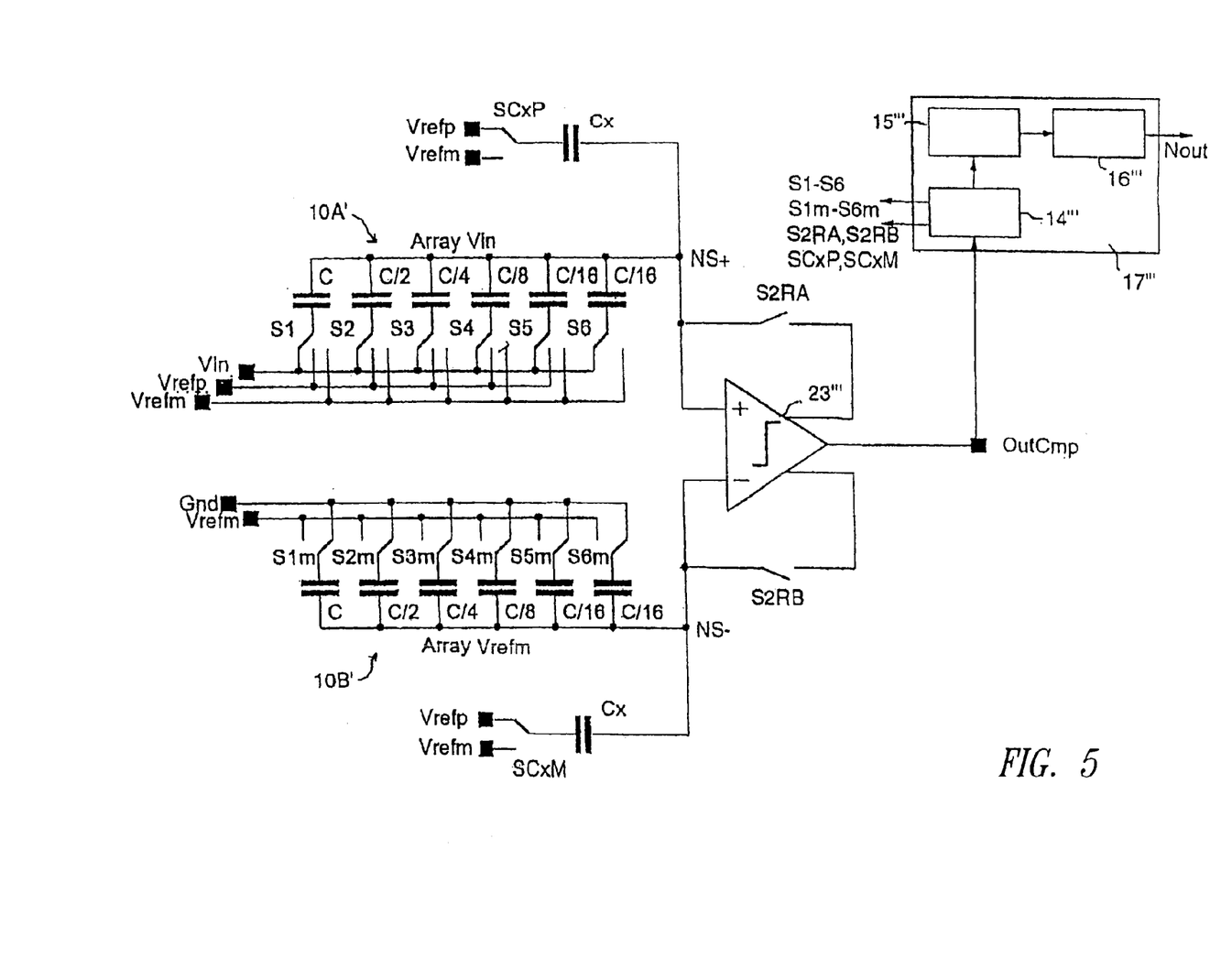

FIG. 5 shows a variant of the converter of FIG. 4 that utilizes an expedient that could be used also with the converter of FIG. 3 and makes it possible to do without an external source of the common mode voltage (Vcm), because this voltage is generated by the comparator itself. The latter is to all intents and purposes a fully-differential amplifier that has two switches S2RA and S2RB between the differential inputs and outputs. This configuration of the comparator, though known as such, serves to annul the comparator offset by means of the simultaneous closure of the two switches. When the two switches are closed, the comparator inputs, and therefore also the nodes NS+ and NS–, are forced to the common mode voltage Vcm of the comparator. Given an appropriate comparator design, this voltage is chosen to have the value needed for the correct charging of the capacitor array 10A'. It should be noted that the switches S2RA and S2RB, which are operated in accordance with the same timing program used for the switches SP and SM of FIG. 4, are closed only during the charging phase and remain open during the SAR conversion phase.

To conclude, a single-ended signal can be converted with the utmost precision, because the converter is as insensitive to interferences acting on the supply source and the sources of the reference voltages as it would be if a differential signal were to be converted. This is obtained without using a circuit to transform the single-ended signal into a differential one and without additional capacitor arrays, and therefore also without any supplementary energy consumption and without a greater area being occupied in the integrated circuit. In the third embodiment, the one shown in FIG. 5, the energy and area savings are even greater on account of the fact that it does not need a specific circuit for generating the common mode reference voltage.

It is also clear to a person skilled in the art that the teachings derived from acquaintance with the embodiments of the invention described hereinabove can be applied with the same or even greater advantages to the realization of A/D converters that sample with a number of bits greater than five, for example, by utilizing the known technique of dividing the capacitances into an "upper array" and a "lower array", which makes it possible to interrupt the exponential growth of the capacitance values.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An A/D converter, comprising:
    a first array of sampling capacitors weighted in binary code, each connected between a first circuit node and a central terminal of a controlled switching device associated therewith, said device having a multiplicity of terminals selectively connectable with the central terminal;
    a second array of sampling capacitors weighted in binary code, each connected between a second circuit node and a central terminal of a controlled switching device associated therewith, said device having a multiplicity of terminals capable of being selectively connected with the central terminal;
    reference voltage generator means comprising a common reference terminal, a first and a second differential reference terminal, and a common mode reference terminal;
    an input terminal for analog signals referred to the voltage of the common reference terminal;
    first and second controlled connection means connected, respectively, to the first and the second circuit node for selective connection to the common mode reference terminal;
    a voltage comparator having a first and a second input terminal connected, respectively, to the first and the second circuit node, and an output terminal;
    processing, control, and register means connected to the output of the comparator, to the controlled switching devices, associated with the capacitors and to the controlled connection means to operate said switching devices and said connection means in accordance with a predetermined timing program and as a function of the output of the comparator, to memorize the states of at least some of the switching devices associated with the capacitors and to furnish output signals corresponding to the analog signals applied to the input terminal;
    wherein the multiplicity of selectively connectable terminals of each of the switching devices of the first capacitor array comprises a first terminal connected to the input terminal and a second and a third terminal connected, respectively, to the first and the second differential reference terminal; and
    the multiplicity of selectively connectable terminals of each of the switching devices of the second array comprises a first terminal connected to the common reference terminal and a second terminal connected to the second differential reference terminal.

2. The converter of claim 1 wherein the common mode voltage source is comprised within the comparator.

3. The converter of claim 2 wherein the comparator has a first and a second differential output terminal and wherein the first and the second controlled connection means connected, respectively, to the first and the second circuit node are connected, respectively, between the first node and the first differential output and between the second node and the second differential output.

4. The converter of claim 1 wherein the capacitors of the same weighting of the first and the second array are substantially equal to each other.

5. The converter of claim 1, comprising a first and a second supplementary capacitor connected, respectively, between the first or the second circuit node and the central terminal of a respective two-way switch controlled by the control, processing and register means to selectively connect said central terminal to the first or the second differential reference terminal.

6. The converter of claim 1, comprising a first and a second supplementary capacitor connected, respectively, between the first or the second circuit node and the central terminal of a respective two-way switch controlled by the control, processing and register means to selectively connect said central terminal to a first or a second terminal of a supply voltage source.

7. An A/D converter, comprising:
    a first capacitor array, each capacitor in the first capacitor array having a first terminal coupled to a first node and a second terminal selectively connectable to one of an input terminal, a first reference terminal, and a second reference terminal;
    a second capacitor array, each capacitor in the second capacitor array having a first terminal coupled to a second node and a second terminal selectively connectable to one of a common reference terminal and the second reference terminal;
    first and second switches for selectively coupling the first and second nodes, respectively, to a common mode reference terminal;
    a comparator having a first input coupled to the first node, a second input coupled to the second node, and an output; and
    a processing circuit coupled to the output of the comparator and further coupled to the first and second capacitor arrays and configured to generate an output signal in response to an output of the comparator and to generate control signals to selectively connect the capacitors in the first capacitor array to one of the input terminal, first reference terminal, and second reference terminal, and to selectively connect the capacitors in the second capacitor array to one of the common reference terminal and the second reference terminal.

8. The converter of claim 7 wherein the first and second switches are controlled by the processing circuit.

9. The converter of claim 8, further comprising a first capacitive device having a first terminal coupled to the first node and a second terminal selectively coupleable to one of the first reference terminal and the second reference terminal and a second capacitive device having a first terminal coupled to the second node and a second terminal selectively coupleable to one of the first reference terminal and the second reference terminal.

10. The converter of claim 9 wherein the first and second capacitive devices have control terminals coupled to the processing circuit to receive control signals therefrom.

11. The converter of claim 10 wherein the processing circuit is configured to control the first and second capacitive arrays and the first and second capacitive devices in accordance with a predetermined timing program and as a function of the output of the comparator.

12. The converter of claim 7 wherein a common mode voltage source is coupled to the common mode terminal and is comprised within the comparator.

13. An analog-to-digital converter, comprising:
a first capacitive array comprising a plurality of capacitors, each capacitor having a first terminal coupled to a first node and a second terminal selectively coupleable to one of an input terminal, a first reference terminal, and a second reference terminal;
a second capacitive array comprising a plurality of capacitors, each capacitor having a first terminal coupled to a second node and a second terminal selectively coupleable to one of a common reference terminal and the second reference terminal;
a comparator having a first input coupled to the first node, a second input coupled to the second node, and a first output selectively coupleable to the first node, a second output selectively coupleable to the second node, and a third output;
a first supplementary capacitor having a first terminal coupled to the first node and a second terminal selectively coupleable to one of the first reference terminal and the second reference terminal, and a second supplemental capacitor having a first terminal coupled to the second node and a second terminal selectively coupleable to one of the first reference terminal and the second reference terminal;
a processing circuit having an input coupled to the third output of the comparator, and an output for generating digital output signals in response to analog input signals received at the input terminal, and control outputs coupleable to the first and second capacitive arrays and the first and second supplemental capacitors upon which are generated control signals.

14. The converter of claim 13 wherein the first output of the comparator is selectively coupled to the first node by a feedback switch controlled by the processing circuit, and the second output of the comparator is selectively coupled to the second node by a second feedback switch controlled by the processing circuit.

15. The converter of claim 14 wherein the processing circuit is configured to control the first and second capacitive arrays and the first and second capacitive devices in accordance with a predetermined timing program and as a function of the output of the comparator.

16. The converter of claim 15, further comprising a plurality of switches in the first and second capacitive arrays, each switch having a first terminal coupled to the second terminal of a respective capacitor in the first and second capacitive arrays, a control terminal coupled to the processing circuit, and a second terminal for selectively coupling the capacitor to a respective one of the input terminal, the first reference terminal, and the second reference terminal.

17. The converter of claim 13 wherein each of the capacitors of the first and second capacitive arrays comprise sampling capacitors weighted in binary code.

18. The converter of claim 17 wherein the capacitors of the same weighting of the first and second capacitive arrays are substantially equal to each other.

* * * * *